(12) United States Patent
Ahn et al.

(10) Patent No.: US 7,521,156 B2
(45) Date of Patent: Apr. 21, 2009

(54) PHOTO MASK AND METHOD OF CORRECTING THE TRANSMISSIVITY OF A PHOTO MASK

(75) Inventors: Won-suk Ahn, Yongin-si (KR); Moon-gyu Sung, Seoul (KR); Seong-woon Choi, Suwon-si (KR); Sung-yong Cho, Suwon-si (KR); Jeong-yun Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 598 days.

(21) Appl. No.: 11/045,045

(22) Filed: Jan. 31, 2005

(65) Prior Publication Data

US 2006/0019174 A1    Jan. 26, 2006

(30) Foreign Application Priority Data

Jul. 22, 2004    (KR) .................... 10-2004-0057143

(51) Int. Cl.
*G03F 9/00*    (2006.01)
*G03F 7/20*    (2006.01)

(52) U.S. Cl. .................. 430/5; 430/311; 430/30

(58) Field of Classification Search .......... 430/5, 430/311, 315, 30, 322
See application file for complete search history.

(56) References Cited

U.S. PATENT DOCUMENTS 6,174,775 B1 * 1/2001 Liaw .................. 438/283
2003/0157415 A1 * 8/2003 Ziger .................... 430/5
2004/0151991 A1 * 8/2004 Stewart et al. .......... 430/5

FOREIGN PATENT DOCUMENTS

| JP | 9-61990 | 3/1997 |
|----|---------|--------|
| JP | 10-254125 | 9/1998 |
| KR | 2000-0043248 | 7/2000 |
| WO | WO 2005/008333 | * 7/2004 |

* cited by examiner

*Primary Examiner*—Kathleen Duda
*Assistant Examiner*—Brittany Raymond
(74) *Attorney, Agent, or Firm*—Volentine & Whitt, PLLC

(57) ABSTRACT

A photo mask for use in forming a pattern, such as a photoresist pattern, is corrected to compensate for discrepancies in the transmissivity of the photo mask which results in the pattern having a distribution of critical dimensions that is too great or which deviates too much from the target critical dimension of the pattern. The photo mask includes a transparent substrate, a light-shielding layer pattern defining transmission sites on the transparent substrate, and at least some of which sites have a relatively low transmissivity. The method of correcting the photo mask includes doping a front surface of the transparent substrate of the photo mask with ions. A predetermined number of the sites can be doped to narrow the distribution of the critical dimensions of the pattern formed using the photo mask, or all of the transmission sites of the photo mask can be doped to make the average of the critical dimensions of the pattern closer to the target critical dimension of the pattern.

14 Claims, 9 Drawing Sheets average CD > target CD

PHOTO MASK AND METHOD OF CORRECTING THE TRANSMISSIVITY OF A PHOTO MASK

BACKGROUND OF THE INVENTION

1. Field of the Invention

The present invention relates to the fabrication of semiconductor devices. More particularly, the present invention relates to a photo mask used in a photolithography process in which a pattern is transcribed onto a semiconductor substrate.

2. Description of the Related Art

Generally, the fabrication of a semiconductor device includes several photolithography processes and etch processes to form circuit elements on a semiconductor substrate. Photolithography is a process in which the pattern of a photo mask is transferred to a layer of photoresist on the substrate. More specifically, the photolithography process involves coating the semiconductor substrate with photoresist, exposing the layer of photoresist to light directed through a photo mask so that the pattern of the photomask is transferred to the photoresist, and developing the exposed photoresist using a developer whereby the layer of photoresist is patterned. Subsequently, a layer underlying the photoresist pattern is etched using the photoresist pattern as an etch mask, and the photoresist pattern is removed.

Also, semiconductor devices have become much more highly integrated in recent years. Accordingly, the critical dimensions (CD) of semiconductor devices have become smaller and smaller. Thus, the critical dimensions of the patterns of the photo masks are becoming smaller, and the patterns themselves are becoming much finer. Under such circumstances, a mask error enhancement factor (MEEF) of the photolithography process has increased, and the process of fabricating an effective photo mask has become more difficult.

More specifically, in order to meet the current demand for a highly integrated semiconductor device, the photolithography process must produce a pattern on a substrate whose distribution of critical dimensions is beyond the capability of the photo mask. Furthermore, the complexity of the device requires that the pattern formed in a die of the substrate have a wide distribution of critical dimensions. This requirement makes it difficult to maintain shot uniformity on the semiconductor substrate. Thus, it is very difficult to fabricate an effective photo mask unless the photolithography process has a low MEEF. Recently, however, a method of compensating for the transmissivity of the photo mask has been employed to overcome these limitations. More specifically, the transmissivity of a predetermined portion of the photo mask is altered to produce a critical dimension different from that which is produced from the original photo mask pattern. A conventional method of compensating for the transmissivity of a photo mask will be explained with reference to FIGS. 1A through 1F.

Referring first to FIG. 1A, a photo mask 100 is prepared. The photo mask 100 includes a transparent substrate 105 such as a quartz substrate, a light-shielding layer pattern 110 on the transparent substrate 105, and a chrome pattern 115 disposed at the edge of the light-shielding layer pattern 110. The photo mask 100 may be a phase shift mask (PSM), and in this case, the light-shielding layer of the light-shielding layer pattern 110 is a phase shifter. Alternatively, the photo mask 100 may be a binary mask, in which case the mask consists of a transparent substrate and a light-shielding layer pattern.

A critical dimension of the photo mask 100 is the interval between the elements of the light-shielding layer pattern 110. The areas between these elements define transmission sites, respectively, at which the transparent substrate 105 is exposed and light is transmitted by the mask. That is, the critical dimension is the width of a transmission site. Each photo mask used in the fabrication of a semiconductor device is designed to have a predetermined target critical dimension. However, the actual critical dimension may differ from the target critical dimension due to fabrication errors, or the like. Furthermore, the pattern of a photo mask may have a plurality of critical dimensions, i.e., the critical dimension may vary across the photo mask.

The critical dimension of a semiconductor device is a very important factor in the performance of the device. In particular, the gate length in a highly-integrated device is on the sub-micron order and if this critical dimension of the gate does not correspond to the design CD, the device may experience serious operating defects caused by a short channel effect or the like. Similarly, if the size of a contact hole does not correspond to the design CD of the contact hole, the contact resistance or the like may be so high as to seriously impede the operating speed of the device. Therefore, fabricating semiconductor devices with precise critical dimensions becomes more important as the semiconductor devices become more highly integrated.

Referring to FIG. 1B, the back surface of the transparent substrate 105 of the photo mask 100 is coated with a layer of photoresist 120. Then, the photoresist 120 is exposed to light directed through another photo mask using an exposure apparatus such as a stepper (not shown). As shown in FIG. 1C, the photoresist reacts with the light, whereby its etch characteristics are changed; reference numeral 120' in the figure designates an exposed portion of the photoresist 120.

Referring to FIG. 1D, the photoresist 120 is developed, thereby forming a photoresist pattern 120b. The developing operation may be a wet etch. In the case in which the photoresist 120 is a positive type of resist, the exposed portion 120' of the photoresist is removed, as shown in drawing.

Referring to FIG. 1E, the back surface of the transparent substrate 105 is etched using the photoresist pattern 120b as an etch mask, thereby forming a transparent substrate 105a having a lattice structure whose pattern has a CD less than that of the wavelength of the exposure light (the light that will be used in the photolithography process). The etching operation may be a reactive ion dry etch.

Referring to FIG. 1F, the photoresist pattern 120b is removed, thereby completing the formation of the photo mask 100a. The transmissivity of the light passing through the transparent substrate 105 is altered by the lattice structure of the pattern at the back surface of the photo mask 100a.

The transmissivity of the photo mask is thus affected by the diffraction of the light by the lattice structure (pattern) at the back surface of the transparent substrate. Therefore, the intensity and phase of the transmitted light can be controlled according to a duty ratio or fill factor of each portion of the lattice structure, and by the orientation of the pattern of the lattice structure. Furthermore, the transmissivity can be controlled across the photo mask by designing the lattice structure to have local characteristics, i.e. characteristics according to the position that it occupies in the photo mask. Furthermore, phase changes in the transmitted light may be realized just by providing a lattice of one binary phase. Accordingly, a multi-phase diffraction optical device may be realized by one process.

According to the conventional art as described above, variations in the distribution of the actual CDs from the design CDs of the photoresist pattern and of the ultimate semiconductor device formed using a photo mask may be compensated for by forming a lattice structure at the back surface of the photo mask to alter the transmissivity of the photo mask. However, the turn-around time (TAT) of fabricating the photo mask is slowed by the additional process of forming the lattice structure on the back surface of the photo mask. Furthermore, defects such as scratches or the like may occur on the front surface of the photo mask during the process of patterning the back surface of the photo mask.

SUMMARY OF THE INVENTION

An object of the present invention is to provide a photo mask capable of producing a pattern, such as a photoresist pattern, whose critical dimensions have a high degree of uniformity, and whose critical dimensions approximate that of the target critical dimension of the pattern.

Another object of the present invention is to provide a method of adjusting the transmissivity of a photo mask that will not produce defects on the mask pattern of the photo mask.

Another object of the present invention is to provide a relatively quick and simple method of correcting a photo mask to improve the uniformity of the distribution of critical dimensions of a pattern that can be formed on a semiconductor substrate using the photomask.

Still another object of the present invention is to provide a relatively quick and simple method of correcting a photomask such that the average critical dimension of a pattern that can be formed on a semiconductor substrate using the photomask is closer to the target critical dimension of the pattern.

According to an aspect of the present invention, there is provided a photo mask that includes a transparent substrate, and a light-shielding layer pattern disposed on a front surface of the substrate and defining transmission sites where the transparent substrate is exposed, and wherein the substrate has low transmissivity regions at the front surface thereof. The low transmissivity regions constitute at least some of the transmission sites and have a transmissivity that is less than that of the transparent material of the substrate.

The low transmissivity regions are preferably formed at those transmission sites whose critical dimensions are higher than the average of the critical dimensions of all of the transmission sites. The low transmissivity regions may be formed by impurities such as Ga or Ge ions. The concentration of the ions is preferably proportional to the distribution (range) of the critical dimensions of the transmission sites.

According to another aspect of the present invention, there is provided a method of correcting a photo mask, which includes doping a front surface of a transparent substrate of the photo mask, the front surface being that on which a light-shielding layer pattern of the photo mask is disposed. The light-shielding layer pattern defines transmission sites at which the transparent substrate is exposed. The doping operation is carried out in accordance with the critical dimensions of the transmission sites.

The substrate may be doped only at those transmission sites whose critical dimensions are higher than the average of the critical dimensions of all of the transmission sites. In this case, a photoresist pattern is formed on the front surface of the substrate to expose only part of the front surface before the substrate is doped. Accordingly, the photoresist pattern acts a mask during the doping operation.

The substrate may be doped with Ga or Ge ions. The doping operation may be performed using an ion implanter, or a focused ion beam apparatus.

According to still another aspect of the present invention, there is provided a method of correcting a photo mask, which includes coating a semiconductor substrate with photoresist, exposing the photoresist to light through a photo mask including a transparent substrate and a light-shielding layer pattern on the transparent substrate, developing the photoresist to thereby form a photoresist pattern, measuring critical dimensions of the photoresist pattern, and doping the transparent substrate of the photo mask with ions in accordance with the distribution of the critical dimensions. Preferably, the photoresist pattern is that formed within a single die of the semiconductor substrate.

The doping of the substrate is preferably performed on the front surface of the transparent substrate on which the light-shielding layer pattern is disposed.

The dopant (impurity) may be Ga or Ge ions. The concentration of the ions in the doping operation is preferably proportional to the distribution (range) of the critical dimensions of the photoresist pattern. And, as per above, the doping operation may be performed using an ion implanter, or using a focused ion beam apparatus.

According to still another aspect of the present invention, there is provided a method of correcting a photo mask, which includes coating a semiconductor substrate with photoresist, exposing the photoresist to light through a photo mask including a transparent substrate and a light-shielding layer pattern on the transparent substrate, developing the photoresist to thereby form a photoresist pattern, determining an average of the critical dimensions of the photoresist pattern, and doping the transparent substrate of the photo mask in accordance with the difference between the average of the critical dimensions and a target critical dimension of the photoresist pattern.

In this case, as well, the dopant may be Ga or Ge ions. Also, the concentration of the ions in the doping operation of is preferably directly proportional to the difference between the average of the critical dimensions and the target critical dimension of the photoresist pattern. Still further, the doping operation may be performed using an ion implanter or a focused ion beam apparatus.

BRIEF DESCRIPTION OF THE DRAWINGS

The above and other objects, features and advantages of the present invention will become more apparent from the following detailed description of the preferred embodiments thereof made with reference to the attached drawings in which.

DETAILED DESCRIPTION OF THE PREFERRED EMBODIMENTS

Figure 1A:
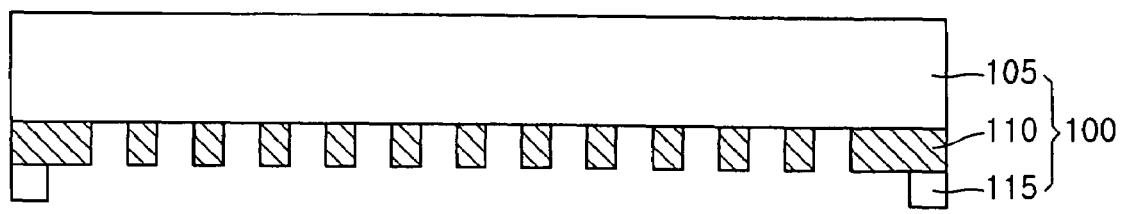
FIGS. 1A through 1F are sectional views of a substrate illustrating a conventional method of making a photo mask.
Figure 1B:
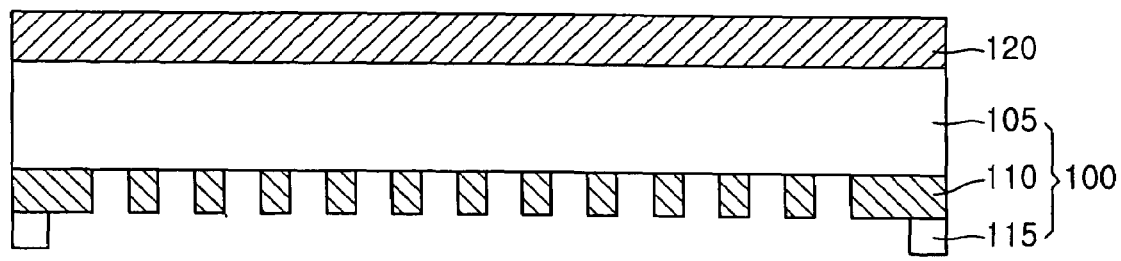
Figure 1C:
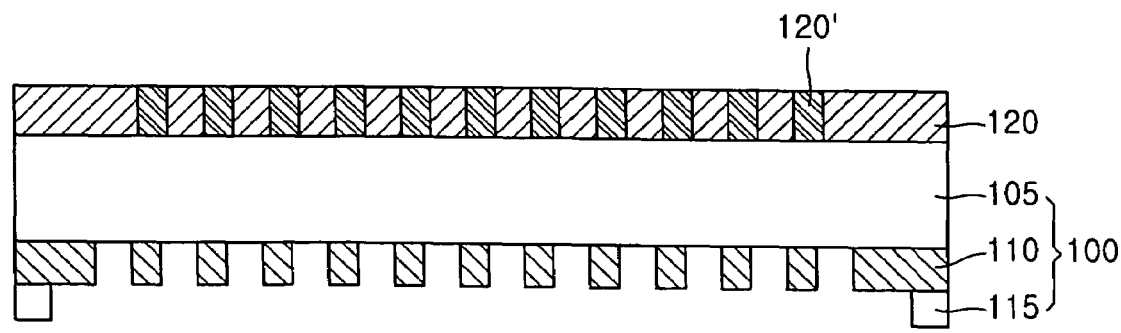
Figure 1D:
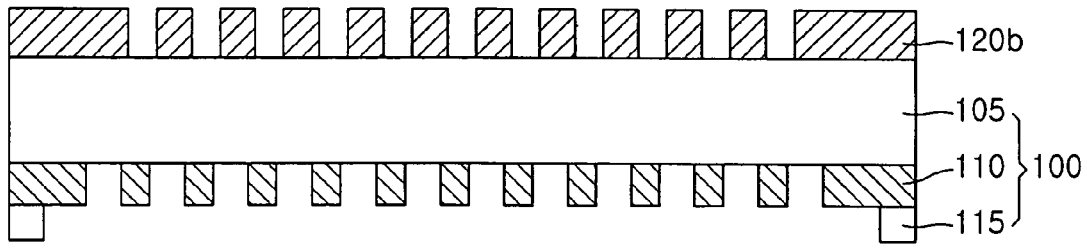
Figure 1E:
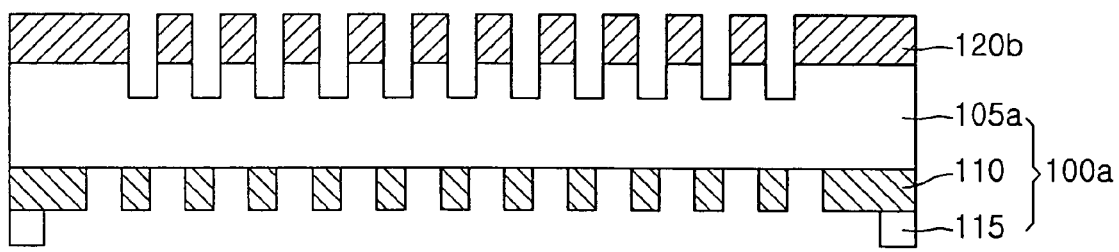
Figure 1F:
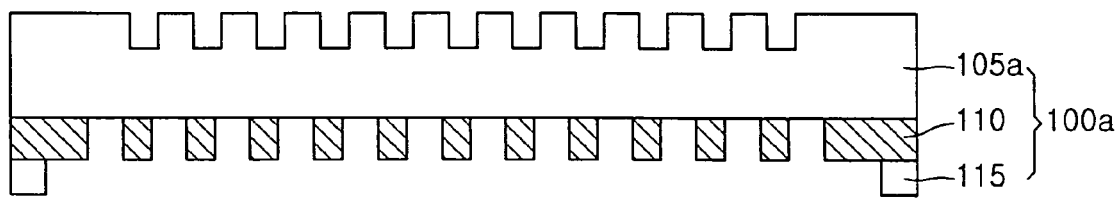

The present invention will now be described more fully hereinafter with reference to the accompanying drawings. In the drawings, the thicknesses of layers and regions are exaggerated for clarity. Also, like reference numerals are used to designate like elements throughout the drawings.

Figure 2A:
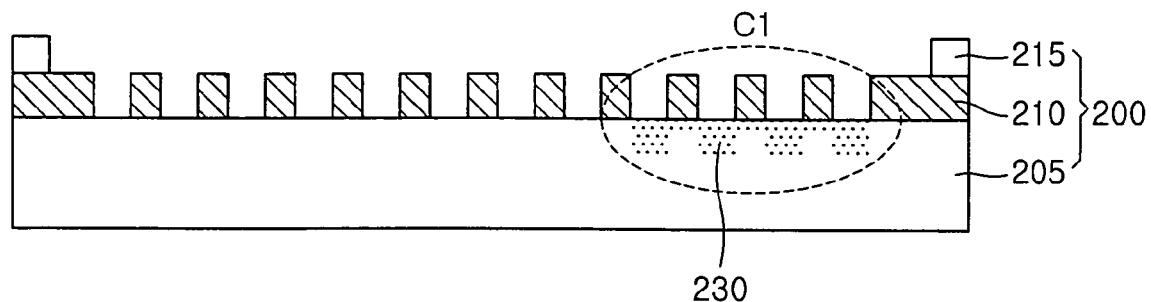
FIGS. 2A and 2B are sectional views of photo masks according to the present invention.

Referring to FIG. 2A, a photo mask 200 according to the present invention includes a transparent substrate 205, and a light-shielding layer pattern 210 on the transparent substrate 205. In the case in which the photo mask 200 is a phase shift mask, the light-shielding layer pattern 210 is a phase shifter, i.e., comprises a semi-transparent phase shifting material, and the photo mask 200 may further include a chrome pattern 215 at the outer periphery of the light-shielding layer pattern 210. However, the photo mask of the present invention is not limited to a phase shift mask, but may embody other types of photo masks such as a binary mask.

The transparent substrate 205 may be a quartz substrate, and has low transmissivity regions 230 in a predetermined area C1 of its upper portion. The low transmissivity regions 230 have a transmissivity lower than that of the remainder of the transparent substrate 205. The light-shielding layer pattern 210 is of material that shields (completely blocks) or shifts the phase of light incident thereon. For example, the light-shielding layer pattern 210 may comprise molybdenum (Mo). In any case, the light-shielding layer pattern 210 defines transmission sites at which the transparent substrate 205 is exposed and whereat light is transmitted by the transparent substrate 205.

The critical dimension of the photo mask 200 corresponds to the width of a transmission site. Thus, the photo mask 200 may have a distribution of critical dimensions in accordance with the widths of the transmission sites. Accordingly, the area C1 in which the low transmissivity regions 230 are formed preferably corresponds to a portion of the transparent substrate 205 where the critical dimensions of the photo mask 200 are higher than average.

Furthermore, the low transmissivity regions 230 may be formed by doping the substrate 205 with ions. The ions may be gallium (Ga) ions, or may be germanium (Ge) ions. In this case, the light is reflected or scattered by the ions so that the intensity of the light passing through the doped regions is reduced. Moreover, the higher the concentration of the impurities in the doped regions, the greater the phenomenon, such as scattering, becomes and the greater is the reduction in the intensity of the light passing through the doped regions.

Figure 2B:
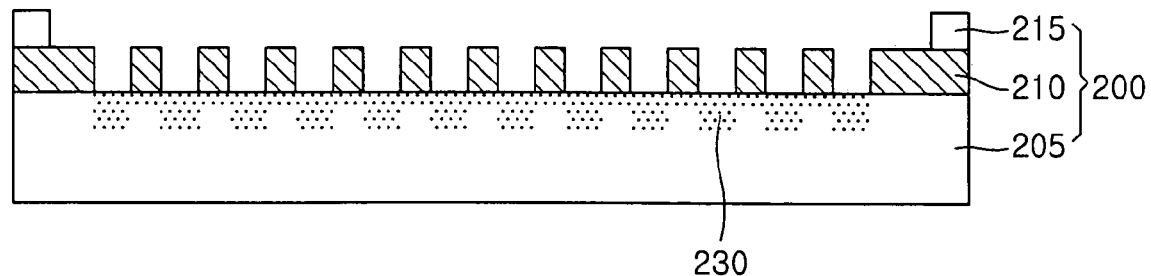

Referring to FIG. 2B, a photo mask 200 according to the present invention may have low transmissivity regions 230 at all of the transmission sites of the transparent substrate 205. That is, all of the portions of the substrate 205 exposed by the light-shielding layer 210 are low transmissivity regions 230.

Figure 2C:
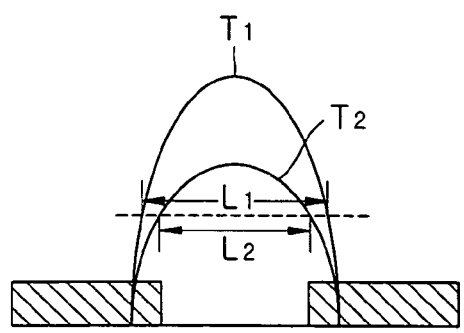
FIG. 2C is a view illustrating the relationship between the intensity of light transmitted by a photomask and the critical dimension of a photoresist pattern formed after the photoresist is exposed to the light.

FIG. 2C illustrates the relationship between the transmissivity of the photo mask and the critical dimension of the photoresist pattern formed on the semiconductor substrate using the photo mask. When the intensities of portions of light passing through transmission sites of the photo mask, and to which the photoresist is exposed, are $T_1$ and $T_2$, respectively, wherein ($T_1 > T_2$), the critical dimensions of the corresponding portions of the photoresist pattern formed by developing the photoresist exposed to the light are $L_1$ and $L_2$ respectively, wherein ($L_1 > L_2$). Thus, if the transmissivity of the photo mask is decreased by a ratio of $T_2$ to $T_1$, the critical dimension of the photoresist pattern formed using the photo mask is accordingly reduced from $L_1$ to $L_2$. This is because the critical dimension is determined by the intensity of the light, when the intensity is above a predetermined level necessary to induce a reaction with the photoresist.

Thus, the critical dimension of a photoresist pattern formed using the photo mask 200 of FIG. 2A is smaller than that of the photoresist pattern formed using a similar photo mask without the low transmission regions 230. Accordingly, the distribution of the critical dimensions of a photoresist pattern formed using the photo mask 200 can be small even if the distribution of the critical dimensions of the photo mask is great. A small distribution of the critical dimensions of the photoresist pattern within a die allows for a high degree of uniformity to be achieved shot-to-shot, i.e., over the entire semiconductor substrate. Therefore, the low transmission regions 230 should be doped at a concentration that is as correspondingly great as the distribution of the critical dimensions of the transmission sites of the light-shielding layer pattern 210.

Furthermore, the average critical dimension of a photoresist pattern formed using the photo mask 200 of FIG. 2B is smaller than the average critical dimension of the photoresist pattern formed using a similar photo mask without the low transmission regions 230. Thus, even if the critical dimension of the light-shielding layer 210 of the photo mask 200 is greater than its target (design) critical dimension, a photoresist pattern having its target critical dimension can be formed using the photo mask. Therefore, the low transmission regions 230 should be doped at a concentration that is as correspondingly high as the difference between the average value of the actual critical dimensions of the photo mask 200 and the target critical dimension.

FIGS. 3A through 3E illustrate a method of correcting a photo mask according to the present invention. The method is used in fabricating a photo mask according to the embodiment of FIG. 2A of the present invention.

Figure 3A:
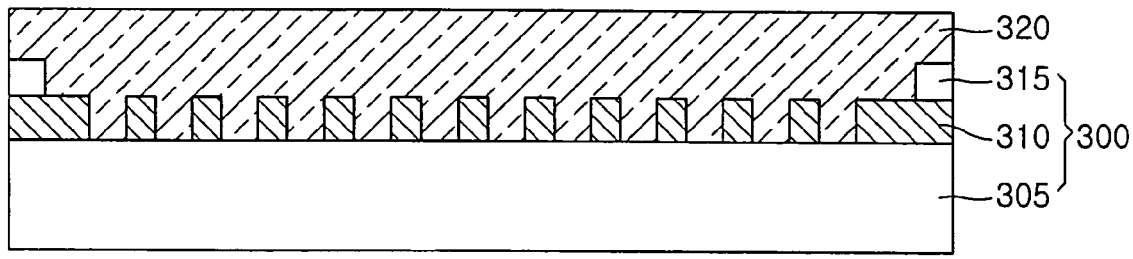
FIGS. 3A through 3E are sectional views of a photo mask illustrating an embodiment of a method of correcting the photo mask according to the present invention.

Referring to FIG. 3A, a photo mask is coated with a photoresist 320. The photo mask includes a transparent substrate 305, a light-shielding layer pattern 310 on the transparent substrate 305, the light-shielding layer pattern 310 having transmission sites having a distribution of critical dimensions relative to a predetermined target critical dimension, and a chrome pattern 315 disposed at the outer peripheral edge of the light-shielding layer pattern 310.

The layer of photoresist 320 may be formed by a spin coating technique in which liquid photoresist is dispensed onto the center of the photo mask 300 and the photo mask 300 is rotated to distribute the photoresist across the mask. Subsequently, the photoresist 320 may be subjected to a soft-bake. The soft-bake reduces the solvent contained in the liquid photoresist and improves the adhesiveness of the photoresist. The soft-bake bake is a heat treatment that can thus be performed using a convection oven, infrared rays or a hot plate, or the like and typically requires only several dozens of seconds to several dozens of minutes.

Figure 3B:
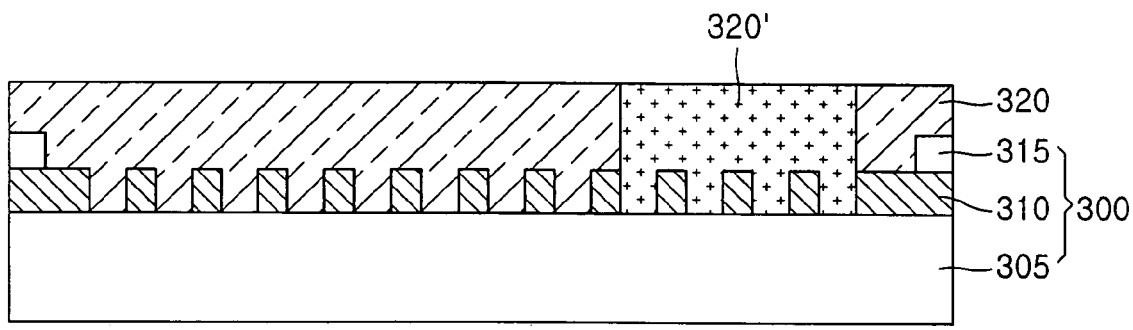

Referring to FIG. 3B, a predetermined area of the photoresist 200 is exposed to light using a separate photo mask in accordance with the critical dimensions of the photo mask 300. The exposure facilitates a reaction between the photoresist and the light. Reference numeral 320' designates the exposed portion of the photoresist 320.

Figure 3C:
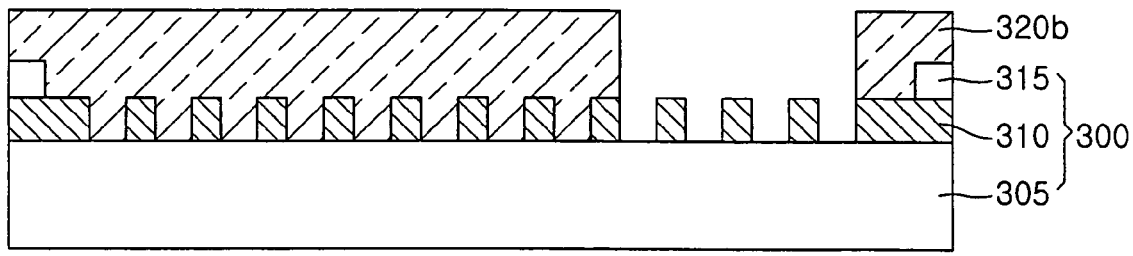

Referring to FIG. 3C, the photoresist 320 is developed, thereby forming a photoresist pattern 320b. The exposed portion 320' of the photoresist is removed by the developing process. The developing process may be a wet etch method or a method wherein an etching solution is sprayed onto the photoresist.

A post-bake may be performed after the developing process. The post-bake removes any solvent remaining in the photoresist pattern 320b, improves the adhesiveness of the photoresist, and increases its etch resistance.

Figure 3D:
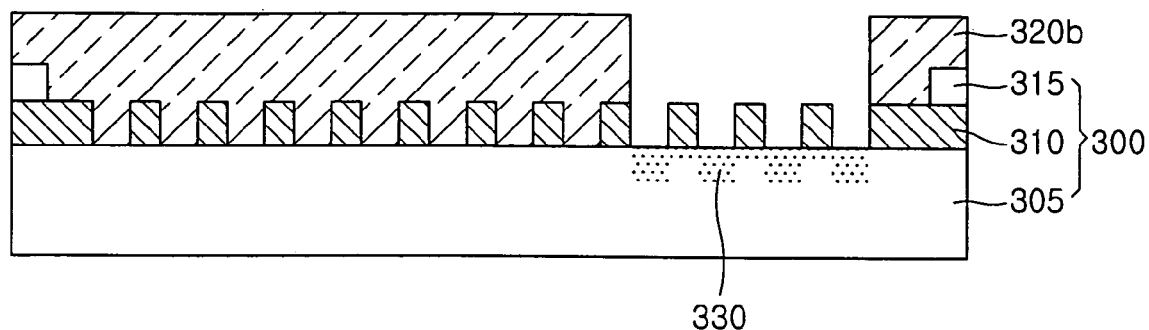

Referring to FIG. 3D, the front portion of the transparent substrate 305 is doped with ions (an impurity) 330 using the photoresist pattern 320b as a mask. The ions 330 are integrated with the transparent substrate 305 and act to scatter or reflect light incident on the doped region of the substrate, thereby decreasing the transmissivity of the photomask at the doped region. The ions may be Ga ions, or Ge ions. The doping may be performed using an ion implanter or a FIB apparatus. Both an ion implanter and a FIB apparatus implant ions by extracting particular ions from a source of ions, accelerating the ions, and focusing the ions into a beam. An ion implanter can accelerate the ions with a much higher energy than a FIB apparatus, and implant a greater amount of ions. On the other hand, it takes one hour more or less to implant ions over the entire photo mask using a FIB apparatus. However, it of course takes less time to scan only a part of the photo mask with a FIB apparatus such as when the photo mask is being corrected to control its transmissivity locally. Thus, the fabrication of a photo mask according to the present invention is simpler than the conventional method and, in particular, the time it takes to correct the transmissivity of the photomask is shorter than the conventional method which takes one or two days on average.

Figure 3E:
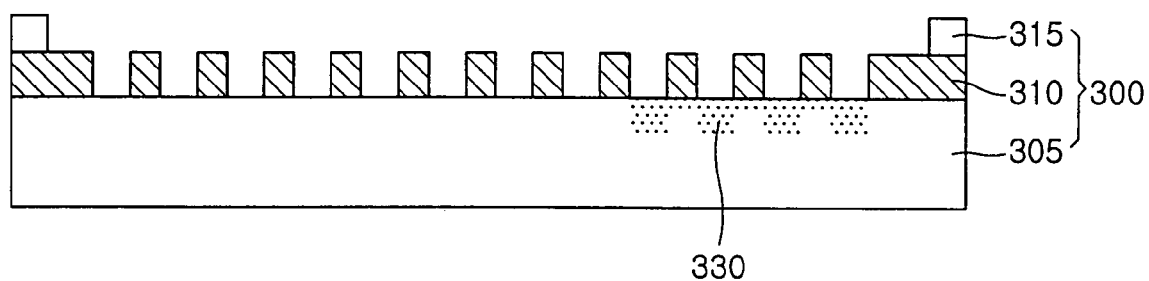

Referring to FIG. 3E, the photoresist pattern 320b is removed. The photoresist pattern 320b may be removed by either a wet etch or a dry etch.

The low transmissivity regions of the transparent substrate 305, which are doped with the ions 330, are preferably located at the upper exposed surface of the transparent substrate 305, at the transmission sites which have critical dimensions higher than the average critical dimension of all of the transmission sites. Thus, the distribution of the critical dimensions a photoresist pattern formed using the photo mask 300 will be small even if the distribution of the critical dimensions of the photo mask 300 is large. Therefore, a high degree of shot uniformity can be produced over the entire semiconductor substrate.

FIGS. 4A through 4F illustrate another method of correcting a photo mask according to the present invention. The method can also be used in fabricating a photo mask according to the embodiment of FIG. 2A of the present invention.

Figure 4A:
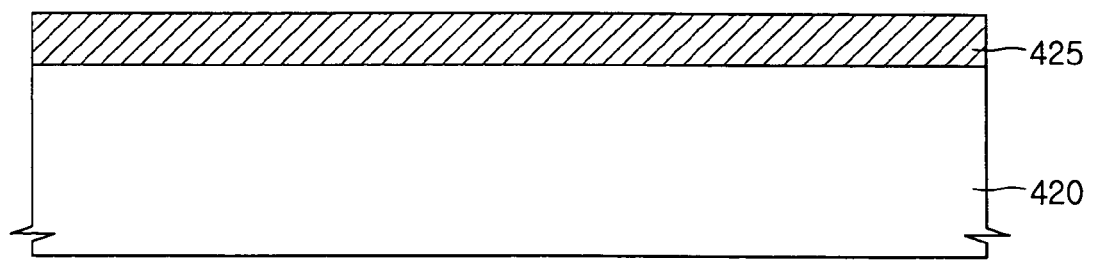
FIGS. 4A through 4F are sectional views of a photo mask illustrating another embodiment of a method of correcting the photo mask according to the present invention.

Referring to FIG. 4A, a semiconductor substrate 420 is coated with photoresist 425. The coating operation may be carried out as described in connection with the embodiment of FIGS. 3A-3E.

Figure 4B:
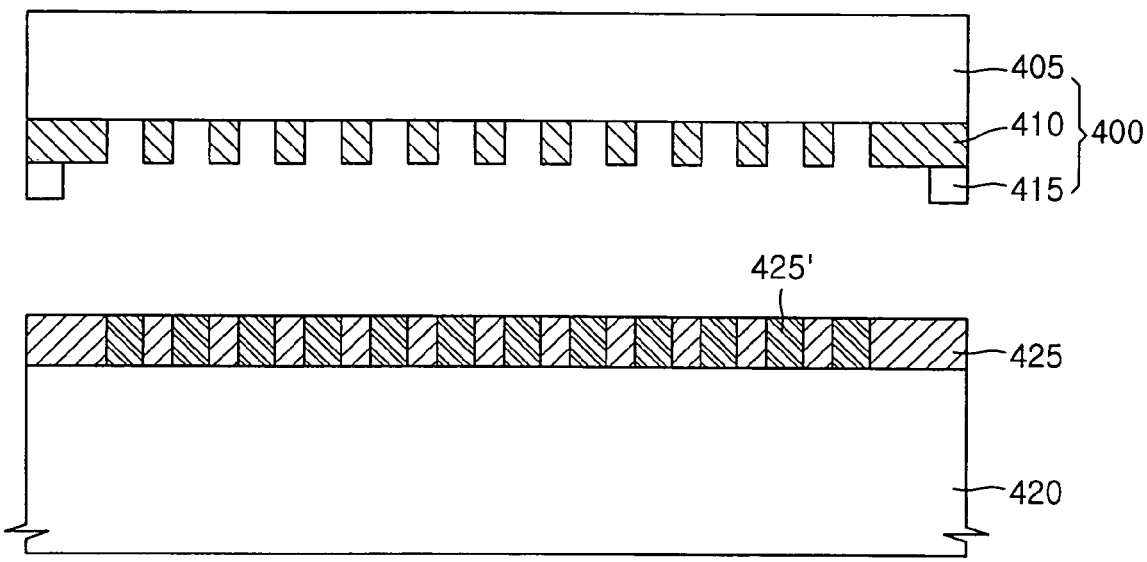

Referring to FIG. 4B, the first layer of photoresist 425 is exposed to light through a photo mask 400 having a transparent substrate 405, a light-shielding layer pattern 410 formed on the transparent substrate 405, and a chrome pattern 415 extending along the outer peripheral edge of the light-shielding layer pattern 410. Reference numeral 425' designates an exposed portion of the first photoresist 425.

The exposure operation can be performed using an exposure apparatus such as a stepper or a scanner. The light focused in the exposure apparatus passes through the transparent substrate 405, i.e., through the transmission sites that are devoid of the light-shielding layer pattern 410, and reacts with the photoresist 425. The transmission sites of the photo mask 400 thus have a one-to-one correspondence with the exposed portions 425' of the first layer of photoresist.

Figure 4C:
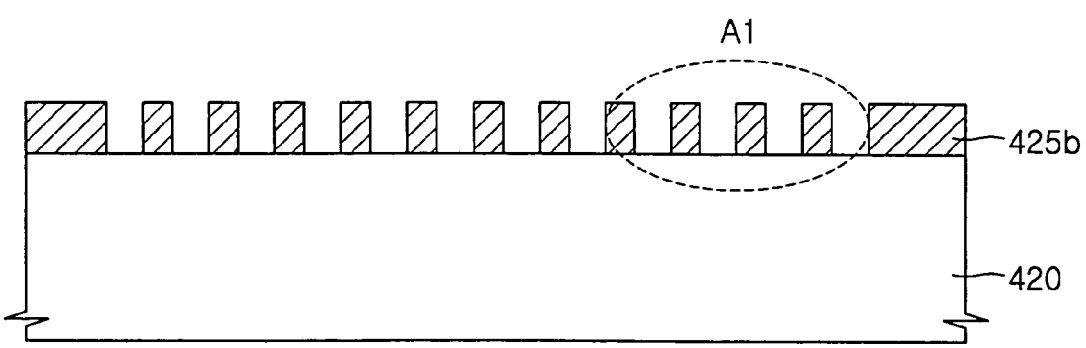

Referring to FIG. 4C, the first layer of photoresist 425 is developed, thereby forming a first photoresist pattern 425b. The developing process may be similar to that described in connection with the embodiment of FIGS. 3A-3E. Next, the critical dimensions of the first photoresist pattern 425b are measured. The dotted area A1 in the figure is representative of an area where the critical dimensions are higher than the average critical dimension of the entire first photoresist pattern. Such differences in the critical dimensions may occur due to process errors in the formation of the photo mask, or non-uniformity in the exposure and the developing processes, or the like.

Figure 4D:
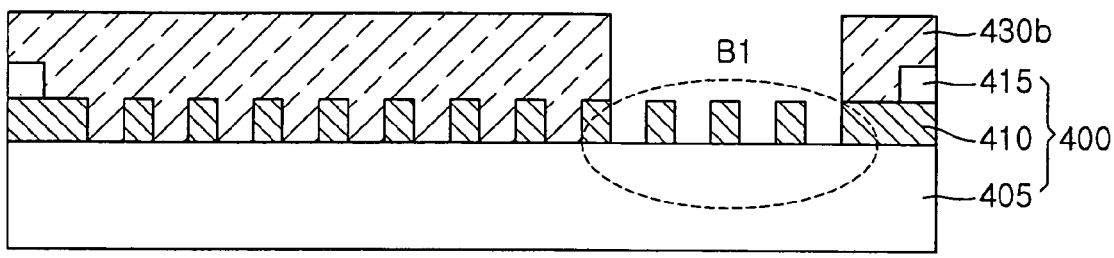

Referring to FIG. 4D, a second photoresist pattern 430b is formed on the photo mask 400, to expose an area B1 that corresponds to the area A1 (FIG. 4C) of the first photoresist pattern 425b. The second photoresist pattern 430b may be formed by a process similar to that used to form the first photoresist pattern 425b.

Figure 4E:
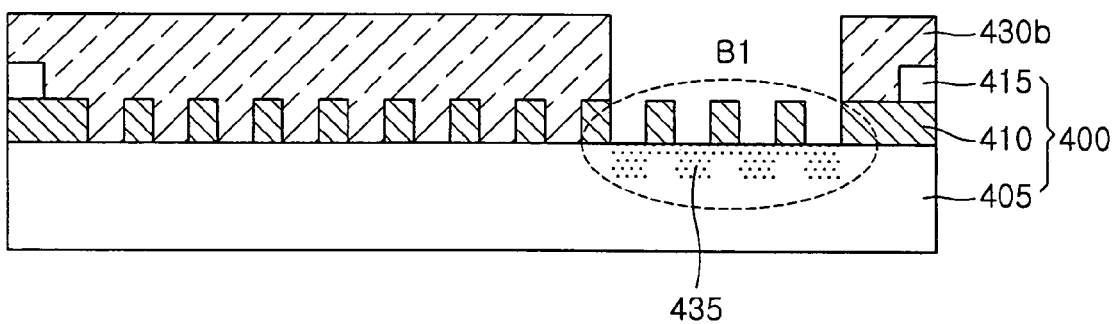

Referring to FIG. 4E, the area B1 of the transparent substrate 405 is doped with ions 435 (an impurity) using the second photoresist pattern 430b as a mask. The ions 435 may be Ga ions, or Ge ions. The ions become integrated with the transparent substrate 405, and thus act to scatter or reflect light, thereby decreasing the transmissivity of the doped region. The doping process may be performed using an ion implanter or a FIB apparatus as described in connection with the previous embodiment.

Figure 4F:
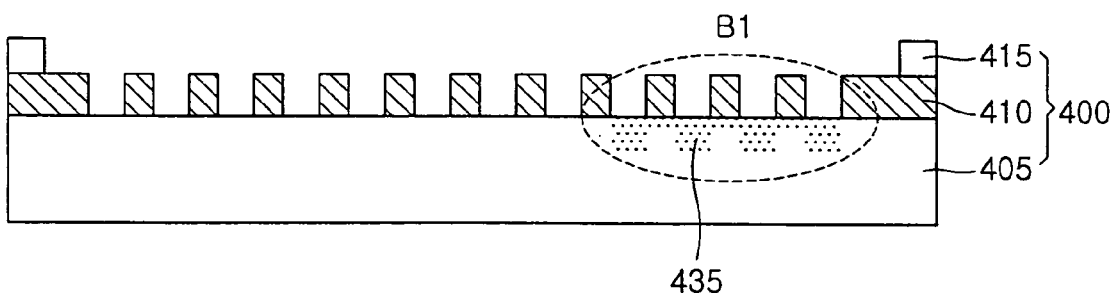

Referring to FIG. 4F, the second photoresist pattern 430b is removed. The second photoresist pattern 430b may be removed by either a wet etch or a dry etch.

Therefore, the transmissivity of the photo mask 400 is less at area B1 of the transparent substrate 405, which is doped with the ions 435, than before the substrate was doped. As a result, the distribution of the critical dimensions of a photoresist pattern on a semiconductor substrate using the doped photo mask 400 shown in FIG. 4F is smaller than the distribution of the critical dimensions of a photoresist pattern that could be formed by the photo mask shown in FIG. 4B (i.e., the photomask before it is doped). Furthermore, because the photo mask 400 can produce a photo resist pattern whose critical dimensions have a small distribution within a die, the photo mask 400 of the present invention also can be used to attain a high degree of shot uniformity, i.e., uniformity in each of the patterns produced over the entire semiconductor substrate.

FIGS. 5A through 5D illustrate still another method of correcting a photo mask according to the present invention. The method is used in fabricating a photo mask according to the embodiment of FIG. 2B of the present invention.

Figure 5A:
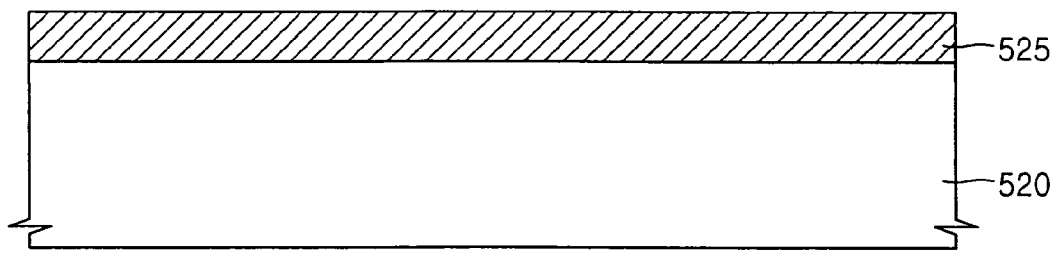
FIGS. 5A through 5D are sectional views of a photo mask illustrating still another embodiment of a method of correcting the photo mask according to the present invention.

Referring to FIG. 5A, a semiconductor substrate 520 is coated with a photoresist 525. The coating of the substrate 520 may be performed as previously described in connection with the other embodiments of the present invention.

Figure 5B:
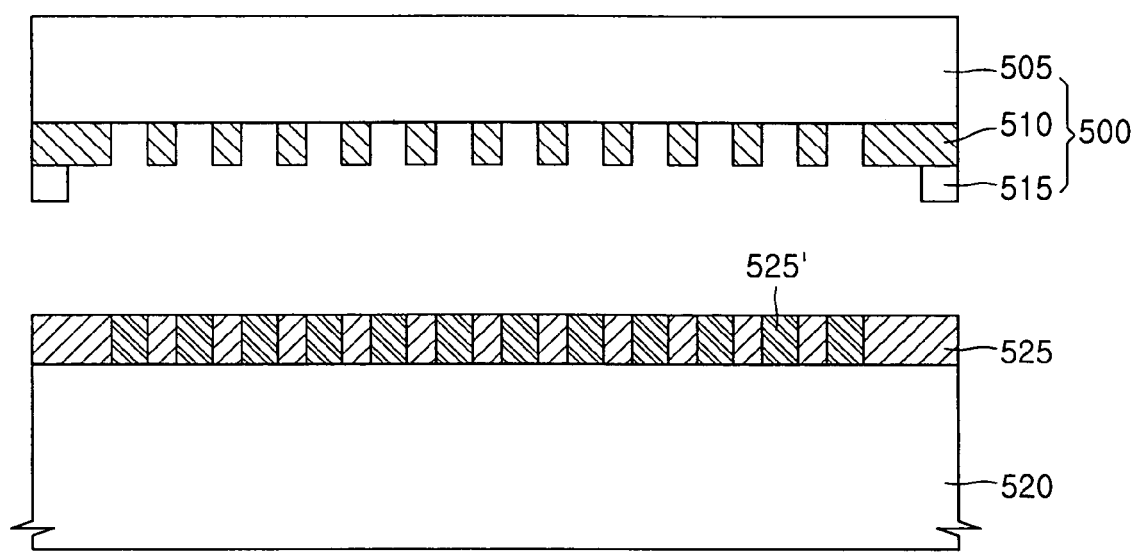

Referring to FIG. 5B, the photoresist 525 is exposed to light through a photo mask 500 having a transparent substrate 505, a light-shielding layer pattern 510 formed on the transparent substrate 505, and a chrome pattern 515 extending along the outer peripheral edge of the light-shielding pattern 510. Reference numeral 525' designates the exposed portion of the photoresist 525. The exposure process is similar to that previously described in connection with the other embodiments of the present invention.

Figure 5C:
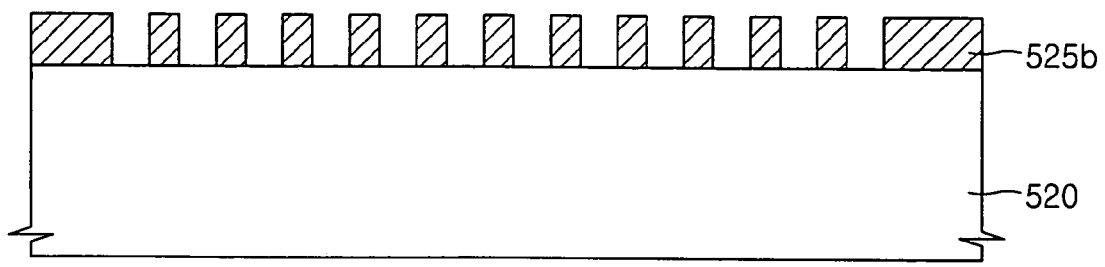

Referring to FIG. 5C, the photoresist 525 is developed, thereby forming a photoresist pattern 525b. The critical dimensions of the photoresist pattern 525b are measured to determine the average critical dimension of the pattern.

In the fabrication of a semiconductor device, a target critical dimension is predetermined for each element of the device and for the photoresist pattern used as an etch mask for forming elements of the device. If the actual critical dimension of an element of the semiconductor device is greater or smaller than the target critical dimension, the resultant device may have characteristics, resistances, or the like that cause the device to mal-function or operate poorly. According to the present invention, the photo mask is corrected, i.e., the transmissivity thereof is adjusted, to compensate for the difference between the average critical dimension of the photoresist pattern that would otherwise be formed prior to correction and the target critical dimension of the photoresist pattern. FIG. 5C illustrates an example in which the average critical dimension is greater than the target critical dimension.

Figure 5D:
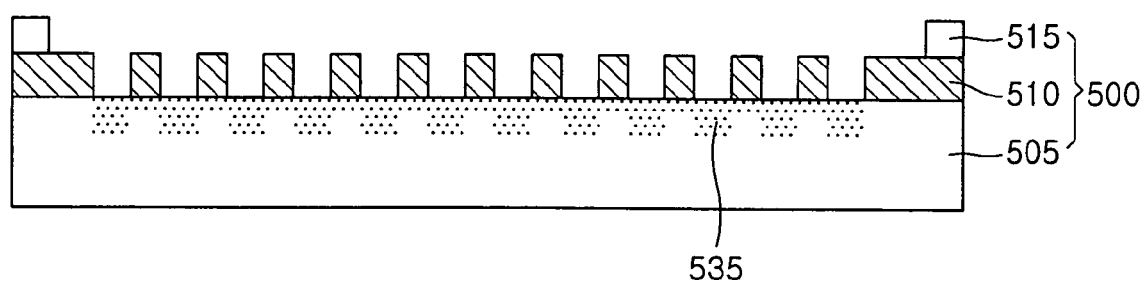

Referring to FIG. 5D, the upper portion of the transparent substrate 505 is doped with ions 535 (an impurity). The ions may be Ga ions, or Ge ions. As described above, the ions are implanted to decrease the transmissivity of the photo mask 500. The doping of the substrate 505 may be performed using an ion implanter or a FIB apparatus as also described above. The dose of the ions is directly proportional to the difference between the average critical dimension and the target critical dimension.

Therefore, the transmissivity of the transparent substrate 505 of the photo mask 500 is decreased. Thus, when a photoresist pattern is formed on a semiconductor substrate using the photo mask 500 doped with the ions 535 as shown in FIG. 5B, the average critical dimension of the photoresist pattern conforms to the target critical dimension.

According to the present invention as described above, the transmissivity of a photo mask is adjusted/corrected by merely doping a predetermined portion of the transparent substrate of the photo mask. This technique is simpler and requires less time than the conventional method. Furthermore, defects and scratches on the front surface of the substrate are prevented unlike the conventional method.

Finally, although the present invention has been particularly shown and described with reference to the preferred embodiments thereof, it will be understood by those of ordinary skill in the art that various changes in form and details may be made thereto without departing from the true spirit and scope of the present invention as defined by the following claims.

What is claimed is:

1. A photo mask comprising:
    a substrate comprising a transparent material that is transparent to an exposure light; and
    a light-shielding layer pattern on a front surface of said substrate, said light-shielding layer pattern having a target critical dimension, and said light-shielding layer pattern comprising light-shielding elements that define transmission sites therebetween and at which sites said substrate is exposed, the transmission sites have critical dimensions corresponding to the distances between adjacent ones of the elements of said light-shielding layer patterns, respectively, and each of the transmission sites have a critical dimension that differs from that of at least one other of the transmission sites such that the critical dimensions of the transmission sites vary amongst one another, and
    wherein the transparent substrate has at the front surface thereof impurities at all of the transmission sites, the impurities constituting low transmissivity regions extending across said transmission sites and having a transmissivity with respect to said exposure light that is less than that of said transparent material of the substrate, and the concentration of the impurities being uniform across all of the transmission sites whose critical dimensions vary amongst each other and correlate with the critical dimensions of the transmission sites.

2. The photo mask of claim 1, wherein the impurities constituting the low transmissivity regions of the substrate comprise Ga or Ge ions.

3. The photo mask of claim 1, wherein said low transmissivity regions are located at all of the transmission sites, and the concentration of the impurities at each of the transmission sites corresponds to the difference between the average value of the critical dimensions of all of the transmission sites and the target critical dimension of the light-shielding layer pattern.

4. A method of correcting a photo mask which has a substrate of a material that is transparent with respect to an exposure light, and a light-shielding layer pattern on the transparent substrate, the light-shielding layer pattern having a target critical dimension and comprising light-shielding elements that define transmission sites therebetween and at which sites said substrate is exposed, and wherein each of the transmission sites has a critical dimension that differs from that of at least one other of the transmission sites such that the critical dimensions of the transmission sites vary amongst one another, the method comprising:
    ascertaining the actual critical dimensions of the transmission sites, respectively; and
    doping the substrate uniformly at regions thereof extending across all of the transmission sites whose critical dimensions vary amongst one another, by implanting impurities into said regions of the substrate at a concentration correlated to the actual critical dimensions of the transmission sites.

5. The method of claim 4, wherein said doping of the substrate comprises implanting impurities into the substrate at a concentration based on the difference between the average of the actual critical dimensions and the target critical dimension.

6. The method of claim 4, wherein said doping is carried out at all of the transmission sites.

7. The method of claim 4, wherein said doping of the substrate comprises doping the substrate with Ga or Ge ions.

8. A method of correcting a photo mask comprising:
    coating a semiconductor substrate with photoresist;
    exposing the photoresist to exposure light directed through a photo mask including a substrate that is transparent with respect to the exposure light, and a light-shielding layer pattern on a front surface of the substrate;
    developing the exposed photoresist, thereby forming a photoresist pattern;
    measuring critical dimensions of the photoresist pattern;
    determining the average of the measured critical dimensions of the photoresist pattern;
    comparing each of the measured critical dimensions to the average of all of the measured critical dimensions;
    identifying an area of the semiconductor substrate where the measured critical dimensions are greater than said average of the measured critical dimensions; and
    doping the substrate of the photo mask by implanting impurities into only an area of the front surface of the substrate of the photo mask corresponding to said area of the semiconductor substrate.

9. The method of claim 8, wherein said doping comprises doping the substrate of the photo mask with Ga or Ge ions.

10. The method of claim 8, wherein said doping comprises doping the substrate of the photo mask with ions at a concentration that is proportional to the distribution of the critical dimensions.

11. The method of claim 8, and further comprising forming a photoresist pattern on the front surface of the substrate to expose only a part of the front surface before the substrate is doped.

12. A method of correcting a photo mask comprising:
    producing a photoresist pattern having a target critical dimension by coating a semiconductor substrate with photoresist, exposing the photoresist to exposure light directed through a photo mask including a substrate that is transparent with respect to the exposure light, and a light-shielding layer pattern on a front surface of the substrate, and developing the photoresist, thereby forming the photoresist pattern;

determining the average of the actual critical dimensions of the photoresist pattern; and doping the substrate of the photo mask by implanting ions into the front surface of the transparent substrate of the photo mask across all of the transmission sites and at a concentration based on the difference between the average of the actual critical dimensions and the target critical dimension of the photoresist pattern.

13. The method of claim 12, wherein the ions are Ga or Ge ions.

14. The method of claim 12, wherein the concentration at which the substrate is doped with the ions is proportional to the difference between the average of the actual critical dimensions and the target critical dimension of the photoresist pattern.

* * * * *